United States Patent
Tsunetou

(10) Patent No.: US 8,120,982 B2
(45) Date of Patent: Feb. 21, 2012

(54) SEMICONDUCTOR DEVICE, CONTROL METHOD FOR SEMICONDUCTOR DEVICE, AND ELECTRONIC DEVICE

(75) Inventor: Kouji Tsunetou, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 224 days.

(21) Appl. No.: 12/692,703

(22) Filed: Jan. 25, 2010

(65) Prior Publication Data
US 2010/0188907 A1 Jul. 29, 2010

(30) Foreign Application Priority Data

Jan. 26, 2009 (JP) .................................. 2009-14494

(51) Int. Cl.
*G11C 17/18* (2006.01)
(52) U.S. Cl. ................................ 365/225.7; 365/189.05
(58) Field of Classification Search ............... 365/225.7, 365/189.05
See application file for complete search history.

(56) References Cited

U.S. PATENT DOCUMENTS

| 6,108,261 A | 8/2000 | Kim et al. |
| 6,574,159 B2 * | 6/2003 | Ohbayashi et al. ........... 365/201 |
| 7,161,865 B2 * | 1/2007 | Fujisawa ...................... 365/226 |
| 2002/0167849 A1 * | 11/2002 | Ohbayashi et al. ...... 365/189.09 |
| 2004/0218328 A1 | 11/2004 | Kuzuno et al. |

FOREIGN PATENT DOCUMENTS

| JP | 2000-082296 A | 3/2000 |
| JP | 2004-246992 A | 9/2004 |

* cited by examiner

*Primary Examiner* — Tuan T. Nguyen
(74) *Attorney, Agent, or Firm* — Fujitsu Patent Center

(57) ABSTRACT

A semiconductor device including a first switch coupled to a first power supply line, a second switch coupled to the first switch and to a second power supply line, and a storage part provided in a path which is between the second power supply line and the first switch, and having a high resistance state and a low resistance state, and wherein the first switch is turned on and the second switch is turned off when a resistance state of the storage part is in a high resistance state.

9 Claims, 4 Drawing Sheets

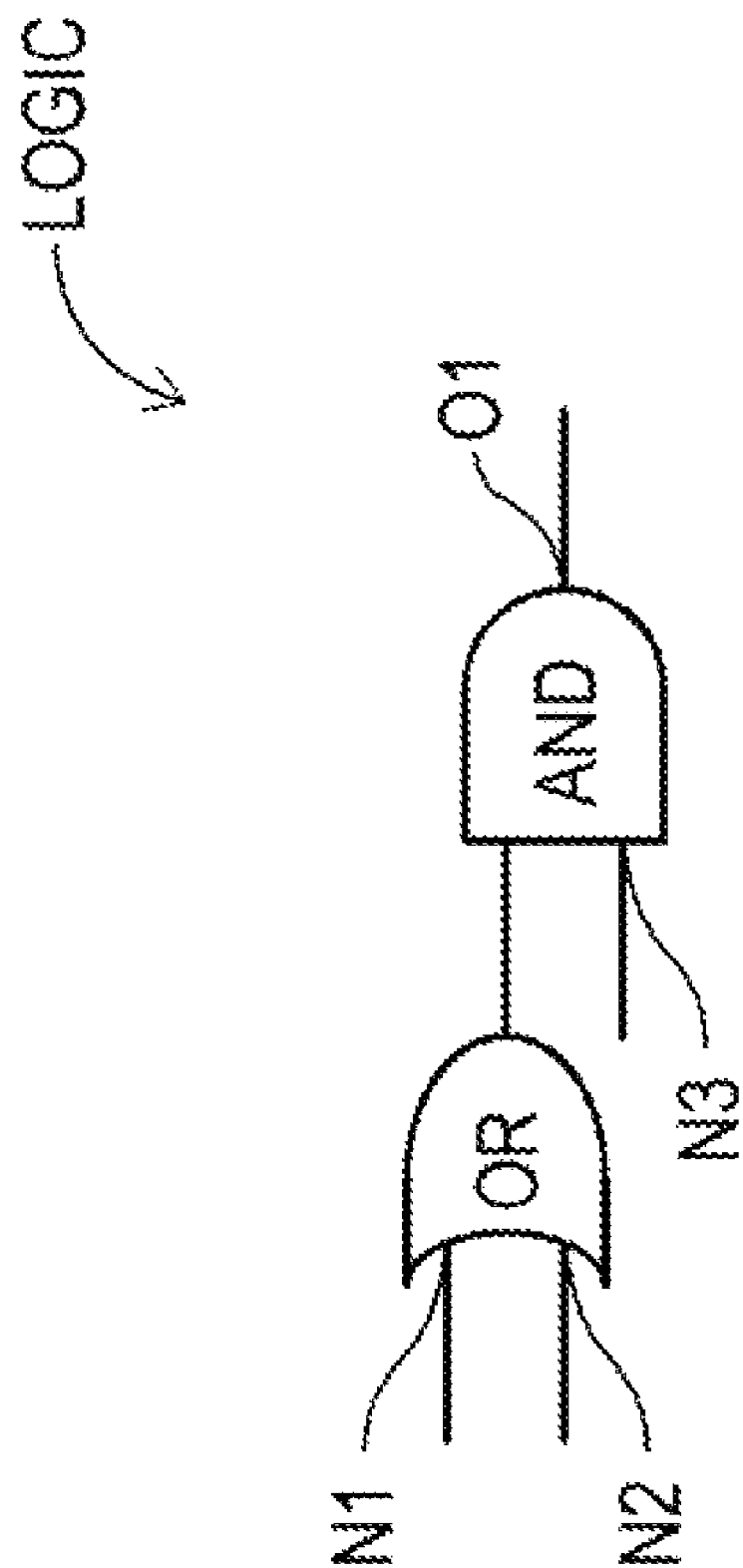

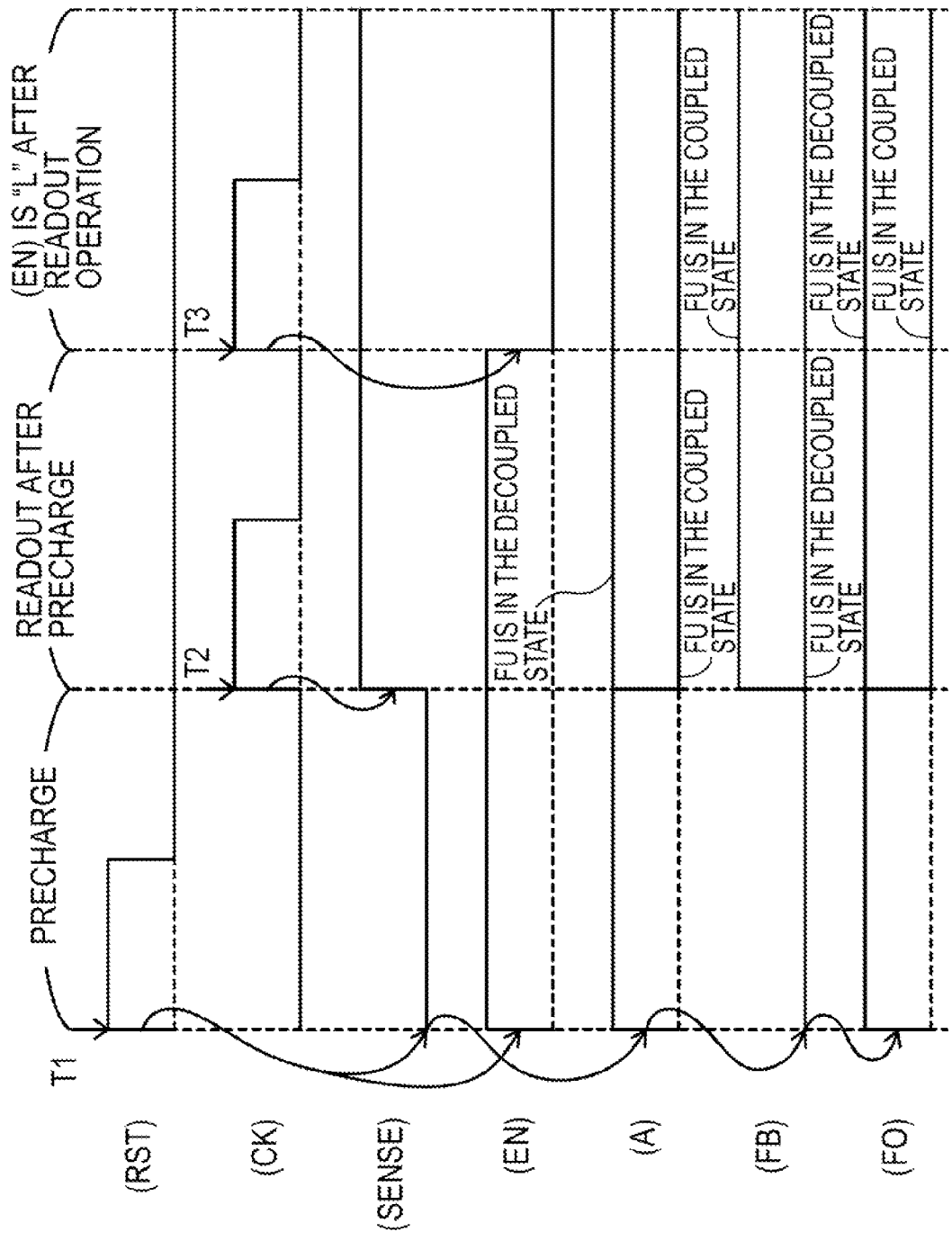

FIG.4

| | (EN) | (SENSE) | MP1 | MN1 | MP2 | (A) | (FB) | (FO) |
|---|---|---|---|---|---|---|---|---|
| PRECHARGE | X | L | ON | OFF | ON | H | L | H |
| READOUT OPERATION AFTER PRECHARGE WHILE FU IS IN THE COUPLED STATE | H | H | OFF | ON | OFF | L | H | L |
| READOUT OPERATION AFTER PRECHARGE WHILE FU IS IN THE DECOUPLED STATE | H | H | OFF | ON | ON | H | L | H |
| (EN) IS "L" AFTER READOUT OPERATION WHILE FU IS IN THE COUPLED STATE | L | H | OFF | OFF | OFF | L | H | L |
| (EN) IS "L" AFTER READOUT OPERATION WHILE FU IS IN THE DECOUPLED STATE | L | H | OFF | OFF | ON | H | L | H |

SEMICONDUCTOR DEVICE, CONTROL METHOD FOR SEMICONDUCTOR DEVICE, AND ELECTRONIC DEVICE

CROSS-REFERENCE TO RELATED APPLICATION

This application is based upon and claims the benefit of priority of the prior Japanese Patent Application No. 2009-014494 filed on Jan. 26, 2009, the entire contents of which are incorporated herein by reference.

FIELD

Embodiments discussed herein are related to a semiconductor device, a control method for the semiconductor device, and an electronic device.

BACKGROUND

Typically, a data signal read from a fuse is input to a buffer circuit including an inverter, an output signal from the buffer circuit is fed back to a latch circuit coupled to an input terminal of the buffer circuit, and the output signal is latched by the latch circuit as discussed in, for example, Japanese Patent Application Laid-Open Publication No. 2000-082296 or Japanese Patent Application Laid-Open Publication No. 2004-246992.

For example, a fuse where a current path between terminals of the fuse is cut off due to electric stress caused by a current flowing through the terminals of the fuse is known. The electric stress caused by the current flowing through the terminals of the fuse generates Joule heat and a low resistance element in the current path passing through the terminals of the fuse melts to be cut off due to the Joule heat. The process is generally called a "fuse blowout." The resistance value between the terminals of the fuse is low before the fuse blowout. When the fuse blowout occurs, the resistance value between the terminals of the fuse becomes high. The change in the resistance value is utilized to store data or information in the fuse.

Preferably, after the application of the electric stress, the low resistance element between the terminals of the fuse melts to be completely cut off and the terminals of the fuse are completely decoupled, that is, the resistance value between the terminals of the fuse is infinite. However, in practice, there may be a case where the terminals of the fuse are not completely decoupled. In such a case, the resistance value between the terminals of the fuse is high.

When the terminals of the fuse are coupled in the high resistance state, a current path is formed to pass from a power supply voltage to a ground potential through the latch circuit and the fuse, and a leakage current may continue to flow through the current path. As long as the power supply voltage is supplied, the leakage current may flow through the current path also after the data or information is read from the fuse. As a result of the leakage current, current consumption may increase.

SUMMARY

According to one embodiment, a semiconductor device includes a first switch coupled to a first power supply line, a second switch coupled to the first switch and to a second power supply line, and a storage part provided in a path which is between the second power supply line and the first switch, and having a high resistance state and a low resistance state, and wherein the first switch is turned on and the second switch is turned off when a resistance state of the storage part is in a high resistance state.

The object and advantages of the invention will be realized and attained by means of the elements and combinations particularly pointed out in the claims.

It is to be understood that both the foregoing summary description and the following detailed description are exemplary and explanatory and are not restrictive of the invention, as claimed.

BRIEF DESCRIPTION OF THE DRAWINGS

FIG. 2 illustrates a LOGIC circuit in FIG. 1, according to an embodiment;

FIG. 3 illustrates signal waveforms obtained when data is read from the fuse in FIG. 1, according to one example of an embodiment; and FIG. 4 illustrates operating states obtained when the data is read from the fuse in FIG. 1, according to one example of an embodiment.

DESCRIPTION OF EMBODIMENTS

Figure 1:
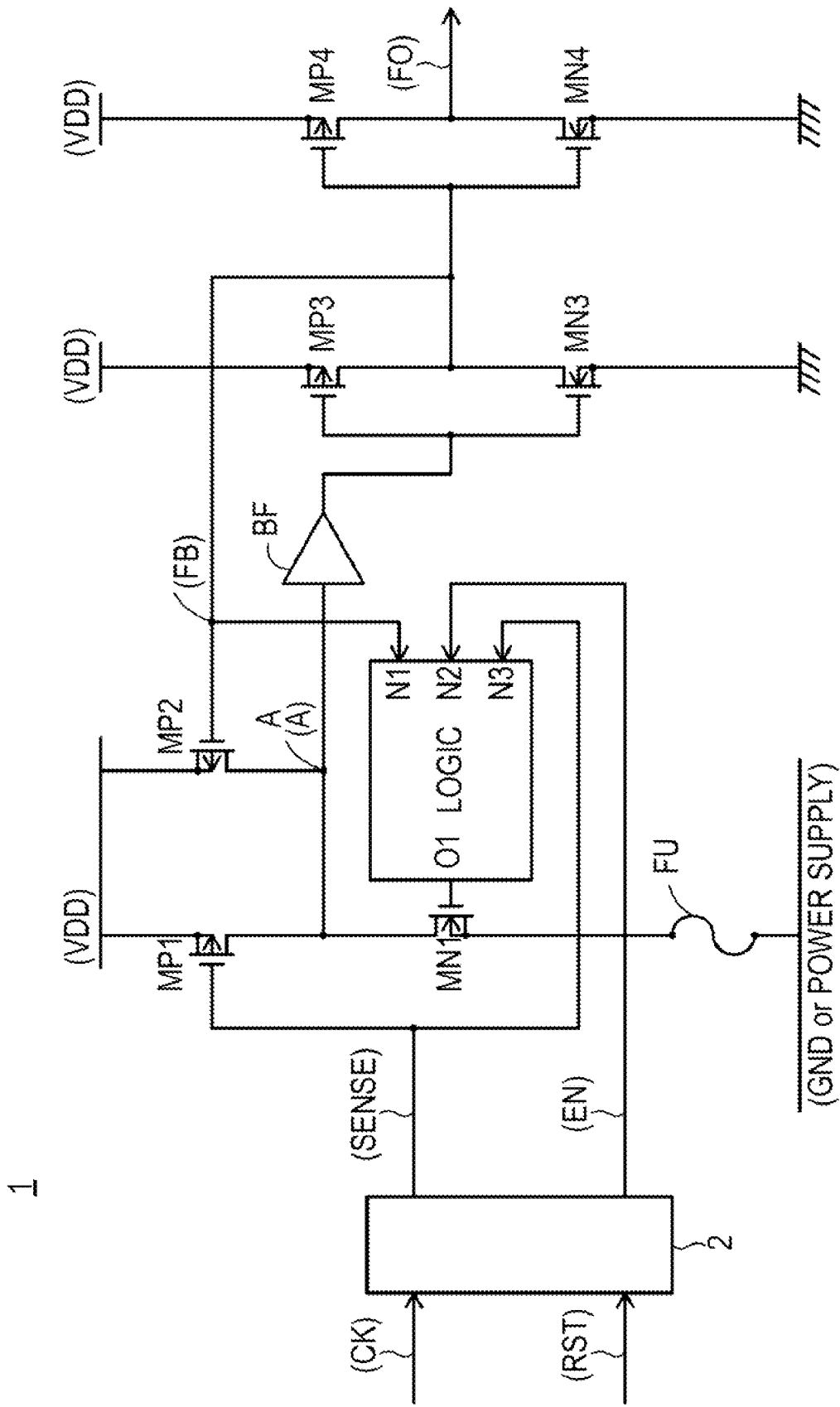
FIG. 1 illustrates a device according to an embodiment.

In the figures, dimensions and/or proportions may be exaggerated for clarity of illustration. It will also be understood that when an element is referred to as being "connected to" or "coupled to" another element, it may be directly connected/coupled or indirectly connected/coupled, i.e., intervening elements may also be present. Further, it will be understood that when an element is referred to as being "between" two elements, it may be the only element in between the two elements, or one or more intervening elements may also be present. Like reference numerals refer to like elements throughout.

FIG. 1 illustrates a device that may be employed in non-integrated or integrated circuits such as Small-Scale-Integration (SSI), Medium-Scale-Integration (MSI), Large-Scale-Integration circuit (LSI), and Very-Large-Scale-Integration (VLSI) circuits. In FIG. 1, a clock signal CK and a reset signal RST are input to a readout circuit 2. The reset signal RST is a pulse signal generated by a Power On Reset (POR) circuit (not depicted) when a power supply is turned on. The readout circuit 2 is initialized based on the reset signal RST output when the power supply is turned on. The readout circuit 2 outputs a data readout signal SENSE and a readout enable signal EN.

As further illustrated in FIG. 1, the data readout signal SENSE is input to a P-channel metal oxide semiconductor (PMOS) transistor MP1 and an input node N3 of a LOGIC circuit. A power supply voltage VDD is applied to the source of the PMOS transistor MP1. The drain of the PMOS transistor MP1, the drain of an N-channel metal oxide semiconductor (NMOS) transistor MN1, the drain of a PMOS transistor MP2, and an input node of a buffer BF are mutually coupled and a coupling point thereof is a node A.

As further illustrated in FIG. 1, the source of the NMOS transistor MN1 is coupled to a first terminal of a fuse FU. A second terminal of the fuse FU is coupled to ground (GND) or a power supply. The fuse FU is set in a coupled or decoupled state depending on data or information to be stored. When the fuse FU is in the decoupled state, the terminals of the fuse FU are substantially open, that is, a resistance value between the terminals of the fuse FU is substantially infinite. However, the decoupled state is not limited to the above, and there may be a case where the terminals of the fuse FU are not completely decoupled and are coupled with a high resistance. When the fuse FU is in the coupled state, the resistance value between the terminals of the fuse FU is low. Further, the power supply voltage VDD is applied to the source of the PMOS transistor MP2.

As further illustrated in FIG. 1, an output node of the buffer BF is coupled to the gate of a PMOS transistor MP3 and the gate of an NMOS transistor MN3. The power supply voltage VDD is further applied to the source of the PMOS transistor MP3. The source of the NMOS transistor MN3 is grounded. The drain of the PMOS transistor MP3, the drain of the NMOS transistor MN3, the gate of a PMOS transistor MP4, the gate of an NMOS transistor MN4, the gate of the PMOS transistor MP2, and an input node N1 of the LOGIC circuit are mutually coupled. The PMOS transistor MP3 and the NMOS transistor MN3 form an inverter. An output signal from the inverter including the PMOS transistor MP3 and the NMOS transistor MN3 is fed back to the gate of the PMOS transistor MP2. A coupling point of an output node of the inverter, which includes the PMOS transistor MP3 and the NMOS transistor MN3, and the gate of the PMOS transistor MP2 is a feedback node FB. Further, the power supply voltage VDD is applied to the source of the PMOS transistor MP4. The source of the NMOS transistor MN4 is grounded. The drain of the PMOS transistor MP4 and the drain of the NMOS transistor MN4 are coupled. The PMOS transistor MP4 and the NMOS transistor MN4 form an inverter. An output voltage FO is output from an output node of the inverter including the PMOS transistor MP4 and the NMOS transistor MN4.

As further illustrated in FIG. 1, a readout enable node of the readout circuit 2 is coupled to an input node N2 of the LOGIC circuit. An output node O1 of the LOGIC circuit is coupled to the gate of the NMOS transistor MN1.

The LOGIC circuit in FIG. 1 is described below with reference to FIG. 2.

As illustrated in FIG. 2, the input node N1 of the LOGIC circuit in FIG. 1 is a first input node of an OR circuit. The input node N2 of the LOGIC circuit in FIG. 1 is a second input node of the OR circuit. An output node of the OR circuit is coupled to a first input node of an AND circuit. A second input node of the AND circuit is the input node N3 of the LOGIC circuit in FIG. 1. An output node of the AND circuit is the output node O1 of the LOGIC circuit in FIG. 1.

FIGS. 3 and 4 illustrate exemplary operations of the device 1 in FIG. 1, wherein the device 1 undergoes precharge before data or information is read from the fuse FU. The term "precharge" as used herein indicates that the node A in FIG. 1 is charged to have the power supply voltage VDD.

As further illustrated in FIGS. 3 and 4, the reset signal RST whose voltage level (RST) is a high (an "H") level is input to the readout circuit 2 (refer to T1 in FIG. 3). The readout circuit 2 outputs the data readout signal SENSE whose voltage level (SENSE) is a low (an "L") level and the readout enable signal EN whose voltage level (EN) is the "H" level. When the data readout signal SENSE is at the "L" level, the PMOS transistor MP1 is turned on. When the data readout signal SENSE is input to the input node N3 of the LOGIC circuit, at whichever level the signal output from the OR circuit and input to the first input node of the AND circuit is, the signal output from the output node O1 of the LOGIC circuit is at the "L" level. When the "L" level signal is input to the gate of the NMOS transistor MN1, the NMOS transistor MN1 is turned off. When the PMOS transistor MP1 is turned on and the NMOS transistor MN1 is turned off, the node A in FIG. 1 is charged to have the power supply voltage VDD and a voltage level (A) of the node A reaches the "H" level.

As further illustrated in FIGS. 3 and 4, the voltage level (A) of the node A is at the "H" level, the PMOS transistor MP3 is turned off and the NMOS transistor MN3 is turned on based on the "H" level voltage input through the buffer BF. As a result, a voltage level (FB) of the feedback node FB reaches the "L" level. When the voltage level (FB) of the feedback node FB reaches the "L" level, the PMOS transistor MP2 is turned on. Accordingly, the node A is coupled to the power supply voltage VDD through the PMOS transistor MP1 and the PMOS transistor MP2 and the voltage level (A) of the node A is maintained at the "H" level. The PMOS transistor MP4 is turned on and the NMOS transistor MN4 is turned off. Thus, a voltage level (FO) of the output voltage FO reaches the "H" level.

As further illustrated in FIGS. 3 and 4, a readout operation is performed after the precharge. The "readout operation," as used herein, indicates an output of the output voltage FO that has a voltage value depending on the data or information stored based on the coupled or decoupled state of the fuse FU. The data or information stored in the device 1 in FIG. 1 is read out in the readout operation. As mentioned above, the readout operation is performed after the precharge has been performed based on the reset signal RST output from the POR circuit (not depicted) when the power supply is turned on. As a result, the data or information stored in the fuse FU is read out as the power is supplied, and internal operating conditions are set and adjusted. Examples of the internal operating conditions include a reference voltage value and an oscillation frequency value. The internal operating conditions may differ from device to device. Therefore, depending on the data or information stored in the fuse FU, the internal operating conditions are adjusted to have target values. Operations of the device 1 in FIG. 1 which are performed before, in, and after the readout operation are described below.

As further illustrated in FIGS. 3 and 4, the clock signal CK whose voltage level (CK) is the "H" level is input to the readout circuit 2 (refer to T2 in FIG. 3). The readout circuit 2 outputs the data readout signal SENSE at the "H" level. When the voltage level (SENSE) of the data readout signal SENSE is the "H" level, the PMOS transistor MP1 is turned off. The data readout signal SENSE at the "H" level is input to the input node N3 of the LOGIC circuit. When the voltage level (RST) of the reset signal RST reaches the "H" level (refer to T1 in FIG. 3), the readout enable signal EN at the "H" level is input to the input node N2 of the LOGIC circuit. As a result, an "H" level signal is output from the OR circuit in FIG. 2 and the "H" level signal is input to the first input node of the AND circuit in FIG. 2. Thus, the signals input to the input nodes of the AND circuit in FIG. 2 reach the "H" level and an "H" level signal is output from the output node O1. The "H" level signal output from the output node O1 is input to the gate of the NMOS transistor MN1 and the NMOS transistor MN1 is turned on.

As further illustrated in FIG. 3 and FIG. 4, when the terminals of the fuse FU are not cut off (in the coupled state), the node A is coupled to the ground potential through the NMOS transistor MN1 and the fuse FU, and the voltage level (A) of the node A reaches the "L" level. When the "L" level voltage of the node A is input to the gates of the PMOS transistor MP3 and the NMOS transistor MN3, the PMOS transistor MP3 is turned on and the NMOS transistor MN3 is turned off. As a result, the voltage level (FB) of the feedback node FB reaches the "H" level. When the voltage level (FB) of the feedback node FB reaches the "H" level, the PMOS transistor MP2 is turned off. After that, the node A is decoupled from the power supply voltage VDD because the PMOS transistor MP1 is turned off while the PMOS transistor MP2 is turned off. As described above, the node A is coupled to the ground potential through the NMOS transistor MN1 and the fuse FU. When the PMOS transistor MP2 is turned off, a leakage current that flows from the power supply voltage VDD to the ground potential through the node A may be reduced or substantially averted. When the PMOS transistor MP4 is turned off and the NMOS transistor MN4 is turned on, the voltage level (FO) of the output voltage FO reaches the "L" level.

As further illustrated in FIGS. 3 and 4, when the terminals of the fuse FU are cut off (when the fuse FU is in the decoupled state), the node A is decoupled from the ground potential by the fuse FU and no current may flow from the node A to the ground potential. When the terminals of the fuse FU are not completely cut off (when the fuse FU is in the coupled state), the node A is coupled to the ground potential through a resistor having a limited resistance value. However, even when the terminals of the fuse FU are not completely cut off, the PMOS transistor MP2 is turned on due to the precharge. An on-resistance value of the PMOS transistor MP2 is lower than the limited resistance value of the fuse FU in the decoupled state. As a result, the voltage level (A) of the node A is maintained at the "H" level after the precharge.

As further illustrated in FIGS. 3 and 4, when the voltage level (A) of the node A is maintained at the "H" level after the precharge, the "H" level voltage of the node A is applied to the gates of the PMOS transistor MP3 and the NMOS transistor MN3. The PMOS transistor MP3 remains off and the NMOS transistor MN3 remains on. The voltage level (FB) of the feedback node FB is maintained at the "L" level. The PMOS transistor MP2 remains on.

When the voltage level (FB) of the feedback node FB is maintained at the "L" level, the PMOS transistor MP4 remains on and the NMOS transistor MN4 remains off. As a result, the voltage level (FO) of the output voltage FO is maintained at the "H" level.

The voltage of the node A is fed back to the node A through the feedback node FB and the voltage level (A) of the node A is maintained.

As further illustrated in FIGS. 3 and 4, the read data is held after the readout operation described above. That is, the voltage level (A) of the node A which is maintained in the readout operation is held. When the voltage level (A) of the node A is the "H" level, the voltage level (A) of the node A is maintained at the "H" level by coupling the node A to the power supply voltage VDD and decoupling the node A from the ground potential. When the voltage level (A) of the node A is the "L" level, the voltage level (A) of the node A is maintained at the "L" level by decoupling the node A from the power supply voltage VDD and maintaining the node A coupled to the ground potential.

Operations of the device 1 in FIG. 1 performed to hold the readout data are described below.

The clock signal CK reaches the "H" level and the clock signal CK at the "H" level is input to the readout circuit 2 (refer to T3 in FIG. 3). Accordingly, the readout enable signal EN reaches the "L" level. After that, the readout enable signal EN at the "L" level is input to the input node N2 of the LOGIC circuit.

As further illustrated in FIGS. 3 and 4, when the fuse FU is in the coupled state, the voltage level (FB) of the feedback node FB reaches the "H" level due to the readout operation and the "H" level voltage of the feedback node FB is input to the input node N1 of the LOGIC circuit. As a result, a signal from the output node O1 of the OR circuit reaches the "H" level even when a signal input to the input node N2 of the LOGIC circuit reaches the "L" level. Accordingly, a signal input to the first input node of the AND circuit reaches the "H" level. The data readout signal SENSE reaches the "H" level due to the readout operation and the data readout signal SENSE at the "H" level is input to the input node N3 of the LOGIC circuit. Thus, the first and second input nodes of the AND circuit receives the "H" level signals and the signal from the output node O1 of the LOGIC circuit is maintained at the "H" level. As a result, the NMOS transistor MN1 remains on.

When the PMOS transistors MP1 and MP2 are turned off due to the readout operation, the node A is maintained decoupled from the power supply voltage VDD. When the NMOS transistor MN1 is maintained on and the fuse FU is in the coupled state, the node A is maintained coupled to the ground potential. As a result, the voltage level (A) of the node A is maintained at the "L" level.

As further illustrated in FIGS. 3 and 4, when the fuse FU is in the decoupled state, the voltage level (FB) of the feedback node FB reaches the "L" level due to the readout operation and an "L" level signal is input to the input node N1 of the LOGIC circuit. When the readout enable signal EN at the "L" level is input to the input node N2 of the LOGIC circuit, a signal output from the output node of the OR circuit reaches the "L" level and a signal input to the first input node of the AND circuit reaches the "L" level.

Due to the readout operation, the data readout signal SENSE reaches the "H" level and the data readout signal SENSE at the "H" level is input to the input node N3 of the LOGIC circuit. However, when an "L" level signal is input to the first input node of the AND circuit, an "L" level signal is output from the output node O1 of the LOGIC circuit. The "L" level signal is input to the gate of the NMOS transistor MN1 and the NMOS transistor MN1 is turned off.

Due to the readout operation, the PMOS transistor MP1 is turned off and the PMOS transistor MP2 is turned on. Accordingly, the node A is maintained coupled to the power supply voltage VDD. Since the NMOS transistor MN1 is turned off, the node A is decoupled from the ground potential not only by the fuse FU but also by the NMOS transistor MN1. The voltage level (A) of the node A is maintained at the "H" level. As a result of turning off the NMOS transistor MN1, the node A may be decoupled from the ground potential.

Various advantages of the aforementioned embodiments are described below.

For example, there may be a case where, when a fuse has a high resistance value for the reason that the fuse is cut but the terminals of the fuse are not completely open, a node and a ground potential are coupled through the fuse with a limited resistance value while the read data is held. In such a case, a current path passing from a power supply voltage to the ground potential through a PMOS transistor, the node, an NMOS transistor, and the fuse with the limited resistance value may be formed. As a result, a leakage current may flow through the current path and current consumption may increase.

According to an embodiment in FIG. 1, however, even when the fuse FU has a high resistance value for the reason that the fuse FU is cut but the terminals of the fuse FU are not completely open, no leakage current may flow from the power supply voltage VDD to the ground potential through the fuse FU by turning off the NMOS transistor MN1 while read data is held. When the NMOS transistor MN1 is turned off, the current path for the leakage current may be cut off and current consumption may be reduced. Data is read from the fuse FU when the power supply voltage VDD is supplied. The NMOS transistor MN1 may be maintained off after a transition to the state for holding the read data until the supply of the power supply voltage VDD is cut off. In the embodiment in FIG. 1, even when the fuse FU in the decoupled state has a limited resistance value, the leakage current may be restrained until the supply of the power supply voltage VDD is cut off. As a result, the current consumed after the start of the supply of the power supply voltage VDD may be reduced.

It should be understood that the present invention is not limited to the specifics of the embodiment described above and that other variations and modifications may be made in accordance with the spirit and scope of the present invention.

For example, in the embodiment in FIG. 1, the fuse FU coupled to the ground potential is described. However, the fuse FU is not limited thereto.

The voltage level (A) of the node A may be set based on the coupled or decoupled state of the fuse FU. The coupling order of the fuse FU and the NMOS transistor MN1 may be reversed. Similar advantages may be obtained even when, in the path including the fuse FU and passing from the power supply voltage VDD to the ground potential, the PMOS transistors MP1 and MP2 are replaced with NMOS transistors, the NMOS transistor MN1 is replaced with a PMOS transistor, and the levels of the voltages input to the gates of the transistors are reversed with respect to those in the embodiment in FIG. 1.

According to the embodiment described above, after information is read from the fuse FU, the leakage current that may flow through the fuse FU may be restrained and current consumption may be reduced.

According to the embodiment described above, information is held based on the change in the resistance value of the fuse FU. To read the information from the fuse FU, a first switch (for example, the PMOS transistor MP1) and a second switch (for example, the NMOS transistor MN1) operate. The first switch is included in the current path passing from the power supply voltage VDD through the fuse FU and controls the current supply to the fuse FU based on the information held in the fuse FU. The second switch is also included in the current path passing from the power supply voltage VDD through the fuse FU. After the information is read from the fuse FU, the second switch complementarily operates with the first switch based on the control signal and controls the current supply to the fuse FU.

According to the embodiment described above, after the information is read from the fuse FU, the first switch and the second switch complementarily operate based on the control signal and the information may be read from the device 1.

When the resistance value of the fuse FU is low, the current for a readout destination of the information is desirably supplied from the fuse FU. In such a case, the first switch is not requested to supply the current and may be turned off while the second switch is turned on.

When the resistance value of the fuse FU is high, the current for the readout destination of the information is desirably supplied not from the fuse FU but from the first switch and therefore the first switch is desirably turned on. When the first switch is turned on, a leakage current may flow from the first switch through the fuse FU because the resistance value of the fuse FU is limited. Since the second switch is turned off in the embodiment in FIG. 1, the leakage current that may flow through the fuse FU may be reduced.

As described in detail above, even when the fuse FU has a high resistance value for the reason that the fuse FU is cut but the terminals of the fuse FU are not completely open, no leakage current may flow from the power supply voltage VDD to the ground potential through the fuse FU by causing the NMOS transistor MN1 to be turned off while the readout data is held.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
a first switch coupled to a first power supply line;
a second switch coupled to the first switch and to a second power supply line; and
a storage part provided in a path which is between the second power supply line and the first switch, and having a high resistance state and a low resistance state, and
wherein the first switch is turned on and the second switch is turned off when a resistance state of the storage part is in a high resistance state.

2. The semiconductor device according to claim 1, wherein the storage part is configured to hold information which is read from a node through which the second switch is coupled to the first switch, and the information corresponds to the high resistance state or the low resistance state.

3. The semiconductor device according to claim 1, wherein the second switch complementarily operates with the first switch based on the resistance state of the storage part.

4. The semiconductor device according to claim 2, comprising:
a buffer circuit coupled to the node, and
wherein the information is latched by the buffer circuit and the first switch.

5. The semiconductor device according to claim 4, wherein the second switch is turned on from a timing at which the information starts to be read from the storage part to a timing based on a state of the node.

6. The semiconductor device according to claim 1, wherein the first switch is turned on and the second switch is turned off before the information is read from the storage part.

7. The semiconductor device according to claim 6, comprising:
a third switch coupled in parallel with the first switch,
wherein the third switch is turned on before the information is read from the storage part and is turned off after the information is read from the storage part.

8. A control method for a semiconductor device, comprising:
precharging a node from which information is read, the information that a storage part holds based on a change in a resistance value of the storage part;
reading the information from the node through a readout path provided between the storage part and the node; and
cutting off the readout path based on the level of the node after the reading.

9. An electronic device comprising:
a first switch coupled to a first power supply line;
a second switch coupled to the first switch through a node, the second switch is also coupled to a second power supply line;
a storage part provided in a path which is between the second power supply line and the node, and having a high resistance state and a low resistance state; and
a circuit operating based on information, and
wherein the first switch is turned on and the second switch is turned off when a resistance state of the storage part is in a high resistance state.

* * * * *